(12) United States Patent
Pfeuffer

(10) Patent No.: US 10,429,470 B2
(45) Date of Patent: Oct. 1, 2019

(54) GENERATION OF PIXEL-TIME SERIES OF AN EXAMINATION OBJECT BY MAGNETIC RESONANCE

(71) Applicant: Siemens Healthcare GmbH, Erlangen (DE)

(72) Inventor: Josef Pfeuffer, Kunreuth (DE)

(73) Assignee: Siemens Healthcare GmbH, Erlangen (DE)

( * ) Notice: Subject to any disclaimer, the term of this patent is extended or adjusted under 35 U.S.C. 154(b) by 97 days.

(21) Appl. No.: 15/699,685

(22) Filed: Sep. 8, 2017

(65) Prior Publication Data

US 2018/0074148 A1 Mar. 15, 2018

(30) Foreign Application Priority Data

Sep. 15, 2016 (DE) .......................... 10 2016 217 675

(51) Int. Cl.
| | |
|---|---|
| *G01R 33/48* | (2006.01) |
| *G01R 33/54* | (2006.01) |
| *G01R 33/56* | (2006.01) |
| *G06T 11/00* | (2006.01) |

(Continued)

(52) U.S. Cl.
CPC ..... *G01R 33/4818* (2013.01); *G01R 33/4828* (2013.01); *G01R 33/546* (2013.01); *G01R 33/561* (2013.01); *G01R 33/5608* (2013.01); *G06T 11/005* (2013.01); *G01R 33/4806* (2013.01); *G01R 33/58* (2013.01); *G06T 11/003* (2013.01)

(58) Field of Classification Search
CPC . G06T 11/005; G06T 11/003; G01R 33/4818; G01R 33/4828; G01R 33/546; G01R 33/5608; G01R 33/561; G01R 33/4806; G01R 33/58
See application file for complete search history.

(56) References Cited

U.S. PATENT DOCUMENTS

| | | |
|---|---|---|
| 2014/0218027 A1 | 8/2014 | Fautz |
| 2016/0116559 A1 | 4/2016 | Cohen |

(Continued)

OTHER PUBLICATIONS

Ma et al., "Magnetic resonance fingerprinting," Nature, vol. 495, No. 7440, pp. 187-192 (2013).

(Continued)

*Primary Examiner* — Rodney A Bonnette
(74) *Attorney, Agent, or Firm* — Schiff Hardin LLP

(57) ABSTRACT

In a method and apparatus the generation of a pixel-time series of an examination object by magnetic resonance measurement data for a undersampled measurement data set are recorded along a k-space trajectory in a repetition of a pulse sequence. The pulse sequence is repeated at least once again in each case with the radiation of other RF pulses and/or with activation in each case of other gradients such that, on each repetition, after the one RF excitation pulse, measurement data are measured along a further k-space trajectory, and are stored in respective measurement data sets. The repetitions are performed such that measurement data are measured along an optimized selection of k-space trajectories in successive repetitions. From each of the measurement data sets obtained, an image data set is reconstructed, from which at least one pixel-time series is compiled for at least one pixel from the reconstructed image data sets.

14 Claims, 6 Drawing Sheets

(51) Int. Cl.
*G01R 33/561* (2006.01)
*G01R 33/58* (2006.01)

(56) References Cited

U.S. PATENT DOCUMENTS

2016/0154078 A1   6/2016   Grodzki
2017/0003365 A1   1/2017   Rosen et al.

OTHER PUBLICATIONS

Jiang et al., "MR Fingerprinting Using Fast Imaging with Steady State Precession (FISP) with Spiral Readout," Magnetic Resonance in Medicine, vol. 74, pp. 1621-1631 (2015).

Cloos et al., "Online Radial Multiband Magnetic Resonance Fingerprinting," ISMRM, p. 608 (2016).

Belliveau et al., "Functional Mapping of the Human Visual Cortex by Magnetic Resonance Imaging," Science, vol. 254, pp. 716-719 (1991).

Ogawa et al., "Brain magnetic resonance imaging with contrast dependent an blood oxygenation," Proc. Natl. Acad. Sci. USA, vol. 87, pp. 9868-9872 (1990).

Lu et al., "Functional Magnetic Resonance Imaging Based on Changes in Vascular Space Occupancy," Magnetic Resonance in Medicine, vol. 50, pp. 263-274 (2003).

Pfeuffer et al., "Mitigation of Spiral Undersampling Artifacts in Magnetic Resonance Fingerprinting (MRF) by Adapted Interleave Reordering," Proceedings of the International Society for Magnetic Resonance in Medicine, ISMRM, 25th Annual Meeting and Exhibition, Honolulu, HI, USA, Apr. 22-Apr. 27, 2017, No. 133 (2017).

Holland et al., "Compressed Sensing Reconstruction Improves Sensitivity of Variable Density Spiral fMRI," Magnetic Resonance in Medicine, vol. 70, No. 6, pp. 1634-1643 (2013).

Wang et al., "Magnetic Resonance Fingerprinting with compressed sensing and distance metric learning," Elsevier, Neurocomputing, vol. 174, 21, pp. 560-570 (2015).

Körzdörfer et al., "Spatial biases in Magnetic Resonance Fingerprinting parameter maps arising from undersampling patterns," Proceedings of the International Society for Magnetic Resonance in Medicine, ISMRM, 25th Annual Meeting and Exhibition, Honolulu, HI, USA, Apr. 22-Apr. 27, 2017, No. 3956 (2017).

Yang et al., "Single-Shot Spiral First-Pass Perfusion Imaging: Full Heart Coverage With High Temporal Resolution," Proceedings of the International Society for Magnetic Resonance in Medicine, ISMRM, 21st Annual Meeting and Exhibition, Salt Lake City, Utah, USA, Apr. 20-26, 2013.

Christen et al., "MR vascular fingerprinting: a new approach to compute cerebral blood volume, mean vessel radius, and oxygenation maps in the human brain," NeuroImage, vol. 89, pp. 262-270 (2014).

GENERATION OF PIXEL-TIME SERIES OF AN EXAMINATION OBJECT BY MAGNETIC RESONANCE

BACKGROUND OF THE INVENTION

Field of the Invention

The invention relates to the improvement of pixel-time series generated by means of magnetic resonance technology.

Description of the Prior Art

Magnetic resonance (MR) technology is a known technology with which images of the interior of an examination object can be generated. In simplified terms, the examination object is positioned in a magnetic resonance scanner in a relatively strong, static, homogeneous basic magnetic field, also called the $B_0$ field, with field strengths of 0.2 tesla to 7 tesla and more, such that the nuclear spins thereof are aligned along the basic magnetic field. To trigger nuclear spin resonances, radio-frequency pulses (RF pulses) are radiated into the examination object and the resulting MR signals are acquired as so-called k-space data, and used as the basis for the reconstruction of MR images or the determination of spectroscopy data. For spatially encoding the measurement data, rapidly switched magnetic gradient fields are superimposed on the basic magnetic field. The recorded measurement data are digitized and stored in a k-space matrix as complex numerical values. An associated MR image can be reconstructed from the k-space matrix populated with such values, for example by multidimensional Fourier transformation.

Magnetic resonance imaging by with a magnetic resonance system can be used to determine the presence and/or distribution of a substance located in the examination object. The substance can be, for example, suspected pathological tissue in the examination object, a contrast medium, a tracer substance, or a metabolic product.

Information about the substances present can be obtained from the measurement data obtained in a variety of ways. A relative simple information source, for example, are image data reconstructed from the measurement data. However, there are also more complex methods that, for example, determine information on the examination object in question from pixel-time series of image data reconstructed from successively acquired measurement data sets.

Methods of this kind include, for example, magnetic resonance fingerprinting methods (MRF methods). In MRF, signal profiles of image data, reconstructed from measurement data recorded in temporal succession with different recording parameters, determined by pattern recognition methods, are compared with signal profiles in a previously determined database of signal profiles characteristic of specific substances ("dictionary"). The comparison takes place in order to determine the substances represented in the image data reconstructed from the measurement data or the spatial distribution of tissue-specific parameters (such as transverse relaxation T2 or longitudinal relaxation T1; so-called T1 and T2 maps) in the examination object depicted.

Magnetic resonance fingerprinting methods are known, for example, from the article by Ma et al., "Magnetic Resonance Fingerprinting", Nature, 495: pp 187-192 (2013), the article by Jiang et al., "MR Fingerprinting Using Fast Imaging with Steady State Precession (FISP) with Spiral Readout", Magnetic Resonance in Medicine 74: pp 1621-1631 (2015) and the article by Cloos et al. "Online Radial Multiband Magnetic Resonance Fingerprinting", ISMRM 2016: p 608.

The cited article by Jiang et al. describes an MRF method with which an FISP ("Fast Imaging with Steady State Precession") sequence is used that is repeated 1000 times with variation of the repetition time TR and flip angle, wherein, in each repetition, measurement data are recorded along a spiral k-space trajectory. The method described requires 24 repetitions to sample the k-space center fully with the k-space trajectory according to the Nyquist theorem and as many as 48 repetitions in order to achieve an overall resolution of 256×256 with which the peripheral k-space is also fully sampled according to the Nyquist theorem. Therefore, the k-space trajectory is rotated in each repetition by an angular increment of 360°/48=7.5°. Hence, a measurement data set of a repetition, from which image data are reconstructed, are undersampled by a factor of 48. Therefore, the reconstructed image data, from which the pixel-time series to be compared with the database are compiled, has strong undersampling artifacts. Although, in their article, Jiang et al. conclude that overall these undersampling artifacts average each other out and hence have no impact on the parameter maps obtained as the results of the comparison with the database, it is still possible for spatial deviations/shifts ("spatial bias"), which are also known as shading artifacts, to occur in the parameter maps.

A further example of methods that derive information on the examination object from pixel-time series of measurement data reconstructed from successive acquired measurement data sets is functional magnetic resonance imaging (fMRI) methods. In functional magnetic-resonance imaging, MR images of the skulls of test subjects or patients are recorded while they are exposed to different stimuli. A comparison of pixel-time series of the MR images recorded with the temporal profile of the respective stimuli produces information on the active brain regions under the respective stimuli. FMRI methods include, for example, DSC ("dynamic susceptibility contrast") methods, BOLD ("blood oxygenation level-dependent") methods or also VASO ("vascular space occupancy") methods, as described, for example, in the article by Belliveau et al., "Functional Mapping of the Human Visual Vortex by Magnetic Resonance Imaging", Science 254: pp 716-719 (1991), in the article by Ogawa et al., "Brain magnetic resonance imaging with contrast dependent on blood oxygenation", Proc. Natl. Acad. Sci. 87: pp 9868-9872 (1990) or in the article by Lu et al., "Functional Magnetic Resonance Imaging Based on Changes in Vascular Space Occupancy" Magnetic Resonance in Medicine 50: pp 263-274 (2003).

For example, with BOLD fMRI methods, generally a temporal series of, for example, T2*-sensitive image data sets are recorded, in which temporary signal changes are identified by statistical analysis with comparison to a functional paradigm, for example also spatial correlations in characteristic temporal signal profiles at resting states ("resting state fMRI"). It is, for example, possible to use a 2D multislice gradient EPI sequence (EPI: "echo planar imaging") with a "zigzag" Cartesian k-space trajectory ("blipped EPI") or also with a spiral k-space trajectory ("spiral EPI") in order to record the measurement data. Herein, so-called "single-shot" methods are used with which, following excitation, a full set of measurement data, for example for a slice, is recorded from which the image data for the pixel-time series is reconstructed. However, the greater the required resolution of the measurement data recorded, the longer the repetition times TR required by the single-shot method.

However, lengthy repetition times TR can result in off-resonance artifacts, distortion artifacts or blurring artifacts.

In order not to prolong the repetition times TR despite higher resolution, it is possible to use so-called parallel acquisition techniques (PAT: "Parallel Acquisition Technique"), such as, for example GRAPPA ("GeneRalized Autocalibrating Partially Parallel Acquisition") or SENSE ("Sensitivity Encoding"), with which a plurality of RF coils is used to record only an undersampled number of measurement data items according to the Nyquist theorem in the k-space. In this method, the "missing" measurement data are supplemented based on sensitivity data for the RF coils used and calibration data from the acquired measurement data before the image data is reconstructed. The fact that only a part of the measurement data actually required for full sampling is recorded (typically, for example, only half or a quarter), the time require to read-out the measurement data, and hence the repetition time, is reduced. However, this requires the above-described sensitivity data from the RF coils and calibration data, thus necessitating additional measurements.

Another possibility for keeping repetition times short and avoiding off-resonance artifacts is the use of so-called "multiple-shot" methods in which the measurement data required for full sampling according to the Nyquist theorem is divided between a number of repetitions so that, following excitation, only a part of the measurement data required for full sampling according to the Nyquist theorem is required. The image data required for the pixel-time series are then reconstructed from the measurement data recorded in the multiple repetitions. However, this procedure has disadvantages since the division of the measurement data between different repetitions can result in phase errors between the measurement data of the different repetitions, which are also known as segmentation artifacts. Another disadvantage is that, corresponding to the repetitions required, the time required for a full data set according to the Nyquist theorem is a multiple of the repetition time TR thus overall greatly increasing the scan time. Particularly in the case of event-related fMRI methods, and also resting state fMRI methods, this is a significant, virtually unacceptable, disadvantage.

SUMMARY OF THE INVENTION

An object of the invention is to avoid or reduce the aforementioned disadvantages with MR methods that use pixel-time series to obtain information on an examination object.

The invention is based on the knowledge that in the case of undersampled recording, according to the Nyquist theorem, of measurement data in a number of repetitions along varied k-space trajectories, the sequence of the k-space trajectories along which measurement data are recorded in the successive repetitions influences the artifacts present in the measurement data, in particular the undersampling artifacts and foldover artifacts present therein.

These are not solely determined by the degree of undersampling, but are also, for example, dependent upon the hardware components of the magnetic resonance system used, such as the gradient power. This is caused by certain device-specific inhomogeneities and scheduled deviations. Such inhomogeneities and scheduled deviations cause the desired, planned k-space trajectories to be inexactly adhered to as a result of which residual moments of the switched gradients can be retained. These residual moments differ in accordance with the gradients, switched for example for the read-out of the measurement data, as a result of which different residual moments are retained for different k-space trajectories and this results in (further) artifacts.

Further reasons as to why actually measured k-space trajectories can differ from the planned k-space trajectories, and hence as to why artifacts can occur, include, for example, uncompensated residual eddy currents and inter-actions/interferences ("cross terms"), inhomogeneities in the B1-Feld or even errors in the time division of the sequence.

The method according to the invention for the generation of a pixel-time series of an examination object by magnetic resonance technology has the following steps. RF pulses are radiated which gradients are activated, and read-out of echo signals generated by the radiated RF pulses and the switched gradients take place according to a pulse sequence such that, after excitation with an RF excitation pulse, measurement data are recorded along a first k-space trajectory and stored in a measurement data set, wherein the measurement data set is undersampled according to the Nyquist theorem. The pulse sequence is repeated at least once with radiation in each case of other RF pulses and/or with switching in each case of other gradients such that, on each repetition, after the one RF excitation pulse, measurement data are measured along a further k-space trajectory and stored in respective measurement data sets. The repetitions are performed such that measurement data are measured along an optimized selection of k-space trajectories in successive repetitions. An image data set is reconstructed for each measurement data set. At least one pixel-time series for at least one pixel is formed from the reconstructed image data sets, which reproduces a signal intensity of the pixel during the course of the recording times of the measurement data sets. The pixel-time series is stored.

The optimization according to the invention of the selection of the k-space trajectories along which measurement data are recorded in successive repetitions enables disruptive artifacts in image data reconstructed from the measurement data in one repetition to be avoided, or at least reduced. This enables the improvement of results obtained by MRF methods, for example for parameter maps of the examination object in question.

The optimization according to the invention of the selection of the k-space trajectories along which measurement data are to be recorded in succession enables the image data from undersampled measurement data measured in a repetition required for the pixel-time series also to be reconstructed with fMRI methods without the impairing the quality of the information to be obtained from the pixel-time series. Segmentation artifacts are avoided since the repetition times TR are shorter than with full recordings according to the Nyquist theorem.

A magnetic resonance system according to the invention has a scanner that has a basic field magnet, a gradient coil arrangement, a radio-frequency antenna and a control computer designed to implement the method according to the invention with a radio-frequency transceiver controller and an optimization processor.

The present invention also encompasses a non-transitory, computer-readable data storage medium encoded with programming instructions (program code) that, when the storage medium is loaded into a control computer or a computer system of a magnetic resonance apparatus, cause the control computer or computer system to operate the magnetic resonance apparatus in order to implement any or all of the embodiments of the method in accordance with the invention, as described above.

DESCRIPTION OF THE PREFERRED EMBODIMENTS

Figure 1:
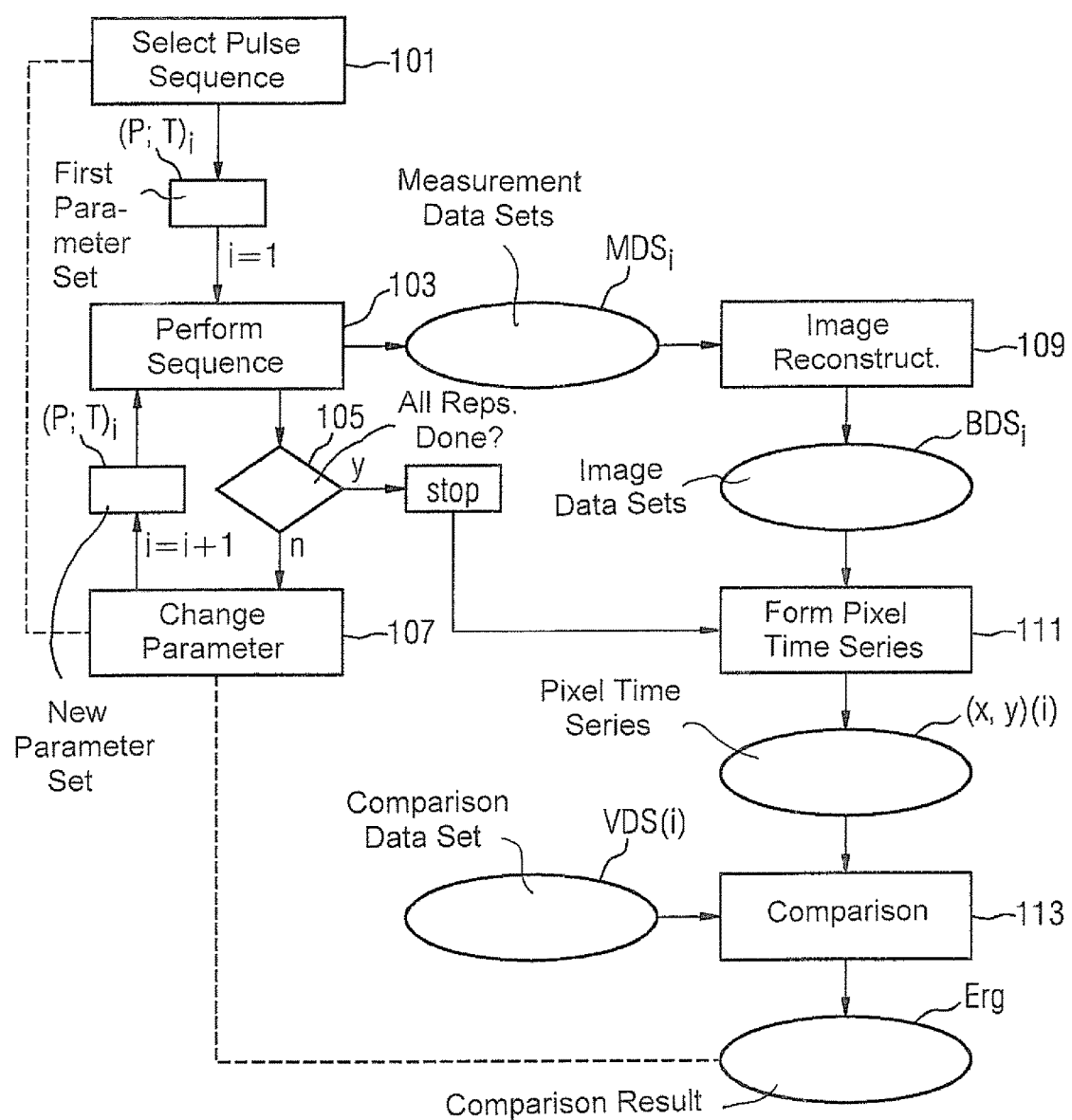
FIG. 1 is a flowchart of the method according to the invention.

FIG. 1 is a flowchart of a method according to the invention for the generation of a pixel-time series of an examination object by magnetic resonance technology.

Herein, a pulse sequence is selected in the usual way, for example in accordance with a desired contrast or other desired properties of measurement data that can be read out with the pulse sequence (block 101).

The pulse sequence is performed in a first repetition (i=1) with a first set of parameters $P_i$, wherein measurement data are to be sampled along a first k-space trajectory $T_i$ $(P;T)_i$. A k-space trajectory along which measurement data is measured in a repetition can sample the k-space with Cartesian, spiral, radial sampling or also in a trajectory mixing one of the aforementioned sampling types or even along a freely chosen trajectory shape.

According to the pulse sequence, RF pulses are radiated into an examination object, gradients are activated, and echo signals generated by the radiated RF pulses and the activated gradients are read out (block 103). After excitation with an RF excitation pulse, measurement data are recorded along the k-space trajectory $T_i$ and stored in a measurement data set $MDS_i$. The k-space trajectory and the sampling resolution are such that the measurement data set $MDS_i$ is undersampled according to the Nyquist theorem. An image data set $BDS_i$ is reconstructed from each measurement data set $MDS_i$ (block 109). It is also possible for only a part of the measurement data contained in the measurement data set $MDS_i$ to be used for the reconstruction. Hence, one image data set $BDS_i$ is obtained per repetition i, i.e. a total of N image data sets $BDS_i$.

Figure 2:
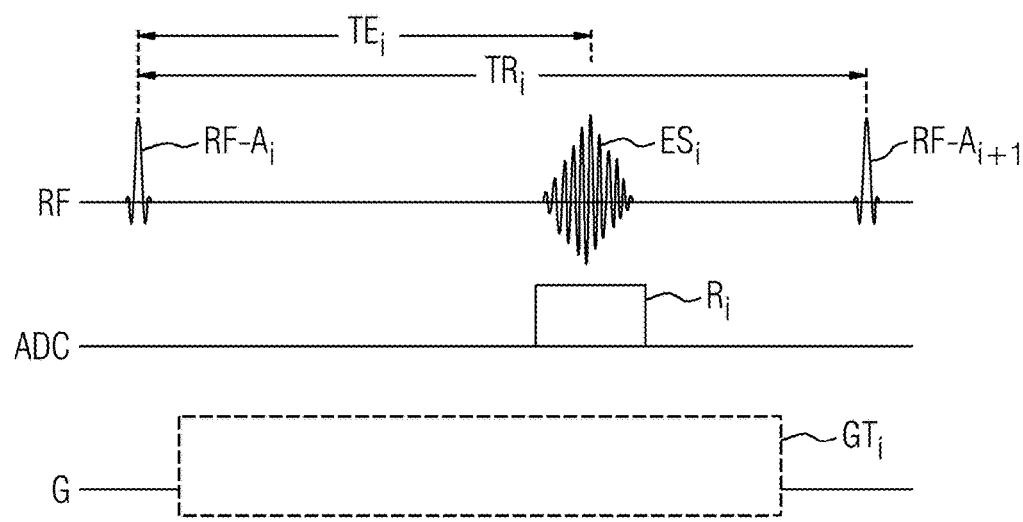
FIG. 2 is a schematic depiction of a pulse sequence that can be used for the method according to the invention.

FIG. 2 schematically depicts an example of a suitable pulse sequence in a pulse-sequence diagram. Following an excitation pulse RF-$A_i$, after an echo time $TE_i$, an echo signal $ES_i$, in each case depicted in the uppermost line (RF) depicting the radio-frequency activity, is read out in a read-out period $R_i$ (ADC). Depending on the pulse sequence, it also possible for further RF pulses to be radiated between the excitation pulse RF-$A_i$ and the echo signal $ES_i$, but these are not shown for simplicity. Following an excitation pulse RF-$A_i$, a gradient train $GT_i$, which can include gradients in all gradient directions G, is activated. Once again, the exact embodiment thereof is dependent upon the type of pulse sequence selected and the k-space trajectory $T_i$, and is known in principle to those skilled in the art. Therefore, the gradient train $GT_i$ is only indicated by a box. Following a repetition time $TR_i$, which can vary according to the invention, the pulse sequence diagram is repeated, as indicated by the following excitation pulse RF-$A_{i+1}$. In each repetition i, other gradients in the gradient train $GT_i$ can be activated and/or other RF pulses can be radiated. For example, in each repetition time $TR_i$ a flip angle of radiated RF pulses, in particular the excitation pulse RF-$A_i$, can be varied. Overall, N repetitions are performed (i=1, ..., N), wherein N is a natural number greater than one and, depending on the application, can be several hundred to several thousand.

In a query 105, the question is asked as to whether all N desired repetitions have been performed and the corresponding N measurement data sets MSDi have been stored. If this is not the case ("n", query 105), an optimal k-space trajectory for the next repetition is selected and the parameters of the pulse sequence adapted accordingly and possibly also varied (block 107). Usually, a selected further k-space trajectory $T_{i+1}$ will differ from a preceding k-space trajectory $T_i$. The pulse sequence is repeated with the next parameters $P_{i+1}$ obtained in this way and the selected further k-space trajectory $T_{i+1}$, $((P;T)_{i+1})$ and hence a new measurement (block 103) performed, such that measurement data are measured in successive repetitions along the optimized selection of k-space trajectories $T_i$, $T_{i+1}$.

The further k-space trajectory $T_{i+1}$ is determined, for example, by applying a rotation and/or a translation to the first k-space trajectory T1, or by shortening another k-space trajectory. It is also possible for other geometric operations, such as mirrorings or enlargements or reductions to be used in order to determine further k-space trajectories from already selected k-space trajectories. It is furthermore conceivable for corrections, such as with respect to eddy currents and/or delays to be used, which can be different in the kx, ky and kz directions and that influence the respective k-space trajectory. For example, a further k-space trajectory can also be constructed as a section of another k-space trajectory to be used, which can also optionally be rotated and/or shifted. The rotations and/or translations used and optionally sections in which a further k-space trajectory is shortened compared to another are selected, such that k-space is covered in a desired manner by all the k-space trajectories that are used.

To this end, it is also possible first to define a set of k-space trajectories $T_i$ that are to be used for the repetitions and which, for example, cover the entirety of k-space in a desired manner in order, for example, to achieve a desired over- or undersampling or sampling distribution in the relevant k-space. In principle, it is also possible for k-space trajectories to be selected that are not derived from one another by geometric operations. The desired sampling distribution can be determined with respect to a desired use of the generated pixel-time series. Hence, the set of k-space trajectories $T_i$ to be used also defines a number n of different k-space trajectories to be used overall $T_i$.

Figure 3:
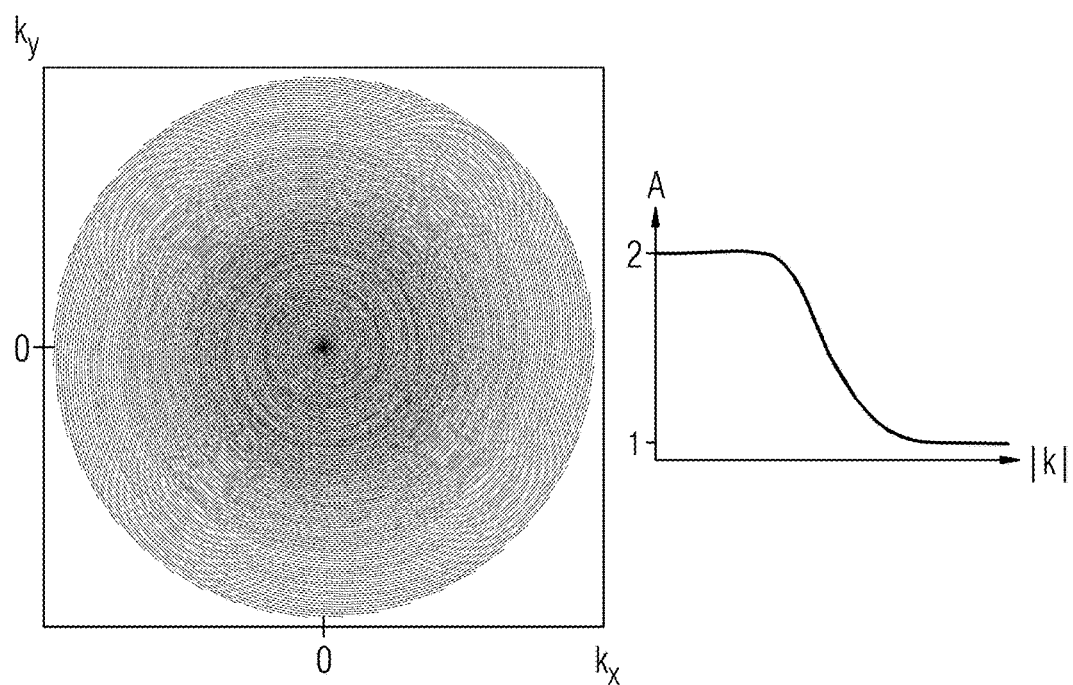
FIG. 3 shows an example of a distribution of k-space trajectories.

An example of a possible distribution of k-space trajectories is shown in FIG. 3. In this example, a spiral k-space trajectory is used that has been rotated around the k-space center in rotation increments of 7.5° (=360°/48) in order to achieve oversampling with the factor 2 in the region of the k-space center overall, and full sampling according to the Nyquist theorem in the peripheral region overall. To achieve this desired sampling, a minimum number n of k-space trajectories should be used along which measurement data are recorded in different repetitions (here n=48). The distribution of the radial sampling rate "A" according to the Nyquist theorem applicable here is plotted on the right against rising values in k-space. With this selection of the coverage of k-space regions and the shape of the k-space trajectory, it can be advisable (particularly with the later use of a pixel-time series generated according to the invention generated within the context of an MRF method) to use each of the n=48 k-space trajectories in at least one repetition, or even to use each of the n=48 k-space trajectories in all repetitions as equally often as possible. This enables a secondary image, reconstructed from all the measurement data recorded, for example a parameter map, to be as free as possible from artifacts caused by temporal undersampling that would otherwise be present.

For example, it is possible for the selection of the k-space trajectories, along which measurement data are to be measured in successive repetitions, to take account of a number of different k-space trajectories to be used overall and/or a degree of undersampling of a measurement data set.

In the selection of the intended sampling, it may be desirable to have the sampling be as homogeneous as possible, at least in specific k-space-regions, for example in a central region and/or in a peripheral region. As in the example in FIG. 3, sampling that becomes denser toward the k-space center can be desirable. In order to obtain a homogeneous distribution of the sampling, it is possible, such as with a Cartesian k-space trajectory, for a maximum translation between two k-space trajectories that are to be used to be determined, and this maximum translation of a desired sampling density can be divided accordingly into equidistant translation increments by which the outermost k-space trajectory is shifted in order to obtain a further k-space trajectory to be used. The length of the equidistant translation increments can be determined as the quotient of the maximum translation divided by the number N of repetitions to be performed, or divided by a (also non-integral) number smaller than N. Similarly, with a determination of the further k-space trajectories by rotation, it is also possible for a maximum rotation (360°) to be divided by the number N of repetitions to be performed, or by a (also non-integral) number smaller than N in order to determine rotation increments. This enables a quantity of k-space trajectories to be used at least once during the course of the repetitions to be defined, which can be taken into account in the selection of the k-space trajectories, along which measurement data are to be measured in successive repetitions. The greater the number by which the maximum translation or the maximum rotation is divided, i.e. the smaller the translation increments or rotation increments, the higher the resolution with respect to the sampled k-spaces altogether.

The further k-space trajectories are then determined by an incremental rotation according to a desired rotation increment and/or by an incremental translation according to a desired translation increment.

K-space trajectories along which measurement data are to be measured in successive repetitions can be randomly selected from such a quantity of k-space trajectories to be used at least once during the course of the repetitions.

K-space trajectories along which measurement data is to be measured in successive repetitions can be selected in a non-chronological sequence from this quantity of k-space trajectories to be used at least once during the course of the repetitions. This enables artifacts to be avoided or at least minimized, that are due to not fully compensated gradient moments or the inadvertent measurement of signals from a preceding repetition.

K-space trajectories along which measurement data are to be measured in successive repetitions can be selected from this quantity of k-space trajectories that are to be used at least once during the course of the repetitions, such that measurement data can be measured along k-space trajectories with alternating gradients in successive repetitions. This enables disruptive eddy currents to be avoided.

In each case, the selection of the k-space trajectories to be measured in succession can be optimized according to at least one of the following criteria: reduction of artifacts in the reconstructed image data sets, reduction of a spatial and/or temporal shift of intensity values in the reconstructed image data sets. In a simple case, for such an optimization, it is possible to compare results of, for example, successive k-space trajectories selected according to different criteria of the aforementioned criteria.

If the pixel-time series according to the invention are compiled for use with MRF methods, possible further optimization criteria can also be the best possible reduction of faulty spatial deviations in the resultant parameter maps and/or a greatest possible homogeneity of parameter values displayed in the resultant parameter maps in regions of the same tissue. Such homogeneity can be controlled, for example, by reference measurements or by measurements on phantoms that are homogeneous at least in sub-regions.

If the pixel-time series according to the invention are compiled for use with fMRI methods, possible further optimization criteria can also be an as-random-as-possible distribution of the k-space trajectories in order to be able to determine an insensitive-as-possible so-called baseline from the pixel-time series. It is also possible, in the case of a multiple application of the same paradigm, in each case during different applications of the paradigm at the same time points of the paradigm, to use non-identical k-space trajectories as far as possible or even to use k-space trajectories that are as orthogonal as possible, in order to achieve an averaging effect.

Figure 4:
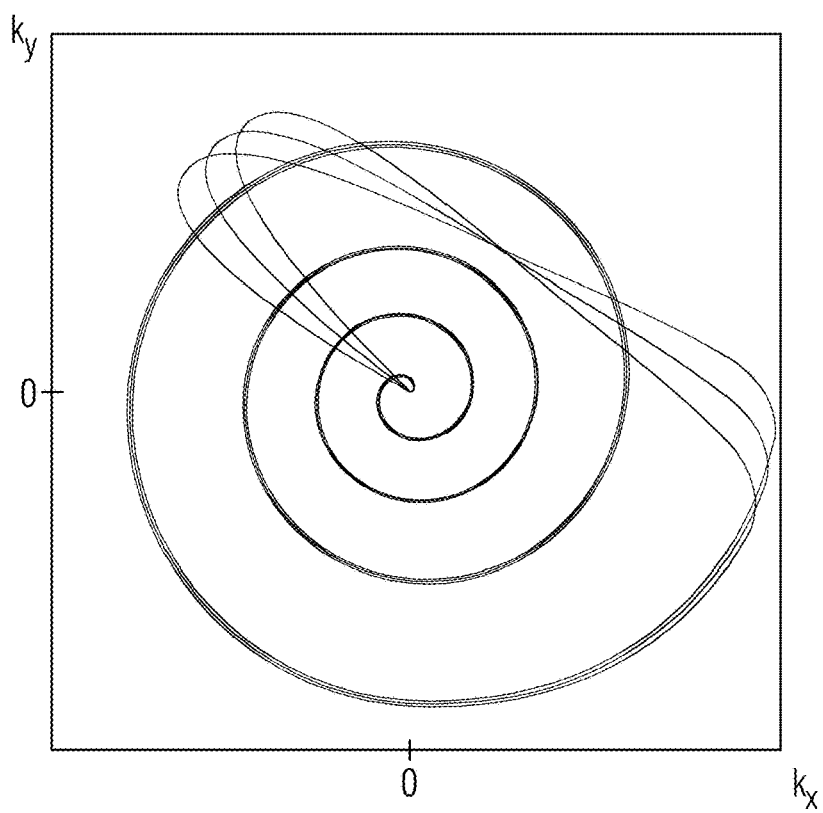
FIG. 4 shows an example of a conventional selection of further k-space trajectories determined by rotation.

FIG. 4 shows an example of a conventional selection of three k-space trajectories to be used in successive repetitions determined by rotation. The k-space trajectories shown correspond to the spiral k-space trajectories shown in FIG. 3, wherein additionally the return path to the k-space center is also shown. In the example shown, each k-space trajectory to be used subsequently is selected chronologically exactly with the rotation increment of 7.5° given in FIG. 3 compared to the preceding k-space trajectory. This is not an optimal selection of the k-space trajectories along which measurement data is to be recorded in succession.

Figure 5:
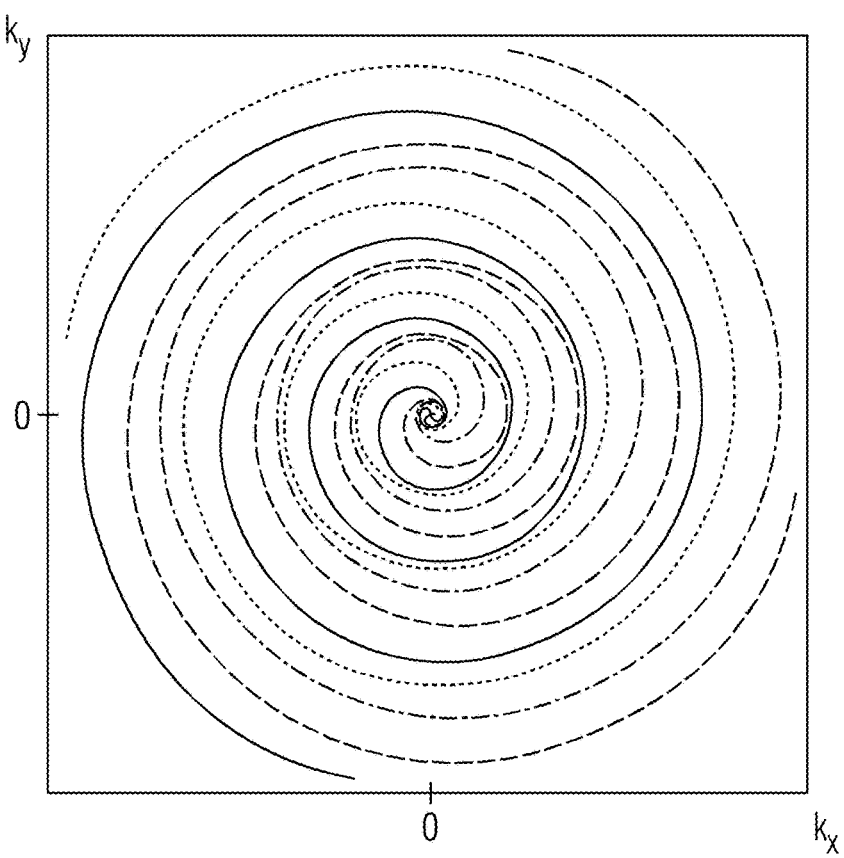
FIG. 5 shows an example of a selection according to the invention of further k-space trajectories determined by rotation.

FIG. 5 shows an example of a selection according to the invention of four k-space trajectories to be used in successive repetitions determined by rotation. The different k-space trajectories are depicted with different types of dashed line to facilitate differentiation. After the few repetitions, the depicted k-space trajectories selected according to the invention cover k-space more broadly than shown in FIG. 3. The k-space trajectories depicted in FIG. 4 were selected randomly from the 48 k-space trajectories depicted in FIG. 3.

Figure 6:
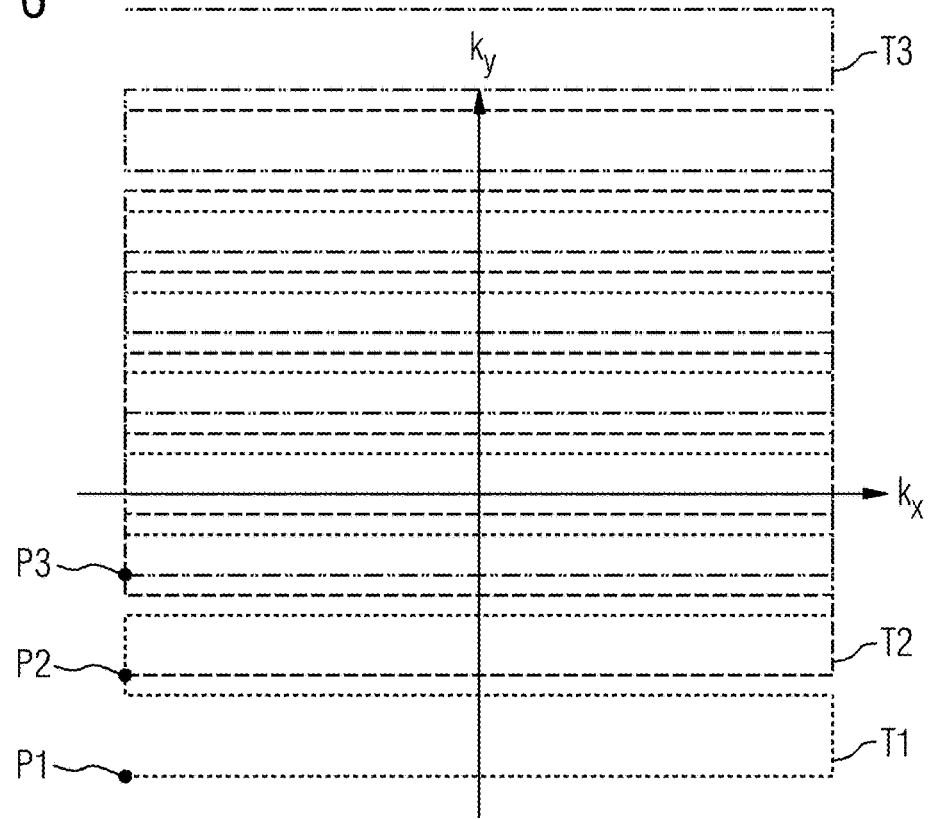
FIG. 6 shows a further example of a selection of further k-space trajectories determined by translation.

FIG. 6 shows an example of a selection of further k-space trajectories determined by translation. Here, the depicted k-space trajectories correspond to Cartesian sampling of the k-space regions, for example according to a EPI pulse sequence. The first k-space trajectory T1 starts at the starting point P1. The second k-space trajectory T2, which is to be used in the following repetition, is shifted by a translation increment of 5 times the smallest translation increment between two k-space trajectories to be used within all the repetitions in the positive ky direction. The third k-space trajectory T3, which is to be used in the third repetition, is again shifted by a translation increment of 5 times the smallest translation increment between two k-space trajectories to be used within all the repetitions in the positive ky direction compared to the preceding k-space trajectory T2. Hence, k-space trajectories T1 and T2 or T2 and T3 to be used are not shifted chronologically with respect to one another according to the smallest translation increment between two k-space trajectories to be used within all the repetitions, but with an increment increased by the factor 5.

A multi-step scheme of this kind can be performed with numerous multiples (not equal to one), including non-integers. Depending on the overall number of different k-space trajectories n to be used and the smallest translation increment between two k-space trajectories $T_i$ to be used within all the repetitions, the selection, for example, can influence how uniformly the k-space is sampled in successive repetitions. With a small multiple, only a small region of k-space is covered in a small number of repetitions (similarly to the case in FIG. 3, q.v.), with larger multiples, a larger relevant region of k-space is sampled with a small number of repetitions.

Generally, the k-space trajectories along which measurement data are measured in successive repetitions can be selected such that a k-space trajectory is determined by translation of a directly preceding k-space trajectory by a multiple V of the smallest translation increment between two k-space trajectories to be used within all the repetitions when the further k-space trajectories are determined by translation of the first k-space trajectory.

Similarly, the k-space trajectories along which measurement data are measured in successive repetitions can also be selected such that a k-space trajectory is determined by rotation of a directly preceding k-space trajectory by a multiple of the smallest rotation increment between two k-space trajectories to be used within all the repetitions when the further k-space trajectories are determined by rotation of the first k-space trajectory.

A multi-step scheme with an incremental selection of successive k-space trajectories to be used, with a rotation and/or translation increment of a multiple of a smallest rotation or translation increment between two k-space trajectories to be used within all the repetitions, may not achieve all the k-space trajectories to be used. If that occurs, it is possible to select as the next k-space trajectory to be used a k-space trajectory that has not been used so far proceeding from which the performance of desired step scheme is repeated.

If all N desired repetitions have been performed and the corresponding N measurement data sets $MSD_i$ are then stored ("y", query 105), no further measurement is performed ("stop"). Also, for at least one pixel (x,y) in the reconstructed image data sets $BDS_i$, a pixel-time series (x,y)(i) is formed that reproduces a signal intensity of the pixel (x,y) during the course of the recording times (and hence during the course of the successively performed repetitions i) of the measurement data sets $MDS_i$. Usually, such a pixel-time series (x,y)(i) is performed for all pixels (x,y) lying within a region of interest in the examination object. The pixel-time series (x,y)(i) formed are stored.

Figure 7:
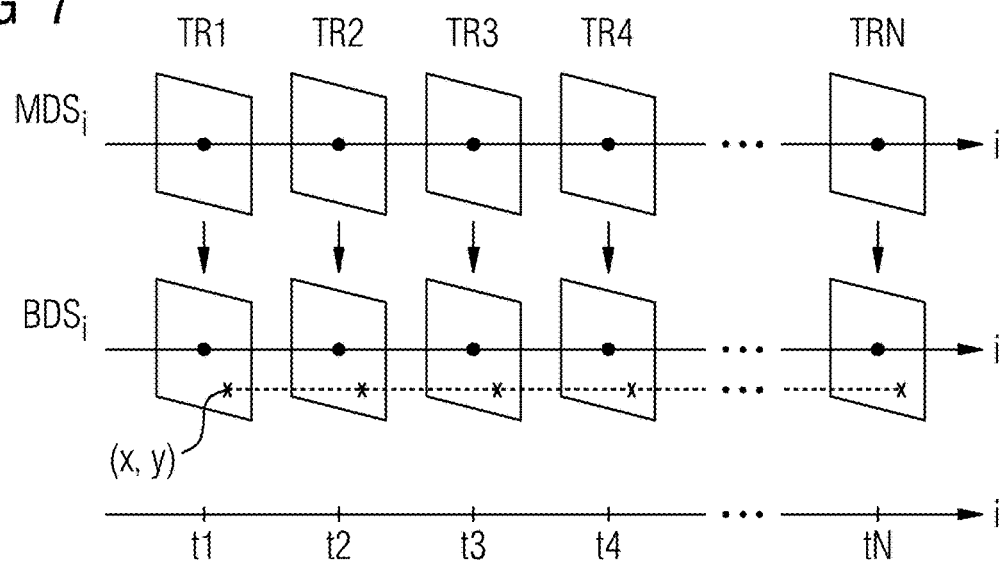
FIG. 7 is a schematic depiction of the relationship between measurement data sets and image data sets over the course of time.

This is further illustrated in FIG. 7, which is a schematic depiction of the relationship between measurement data sets $MDS_i$ and image data sets $BDSi$ over the course of time, i.e. over the course of i.

The uppermost line depicts the undersampled measurement data sets $MDS_i$ as they were recorded in succession in the repetitions $TR_i$, wherein the repetitions i=1, i=2, i=3, i=4 and i=N are explicitly depicted as an example. The second line depicts the image data sets $BDS_i$ reconstructed from the measurement data sets $MDS_i$ in the same way, wherein a pixel (x,y) is marked in the image data sets $BDS_i$ as an example. It is possible for the respective intensities of the pixel (x,y), at the times corresponding to the repetitions $T_i$, to be plotted against time, i.e. against the number i of the repetition, as a pixel-time series.

The stored pixel-time series (x,y)(i) can furthermore be compared with a comparison data set VDS(i) and information on the examination object obtained from the comparison as a result Erg (block 113).

MRF methods and fMRI methods are particularly suitable, wherein the comparison data set can be a signal profile from a magnetic resonance fingerprinting database. The result obtained can be, for example, a quantitative T1 map and/or a quantitative T2 map and/or a quantitative proton density map, or a paradigm of a functional magnetic resonance method, wherein the result obtained can be information on active brain regions.

Figure 8:
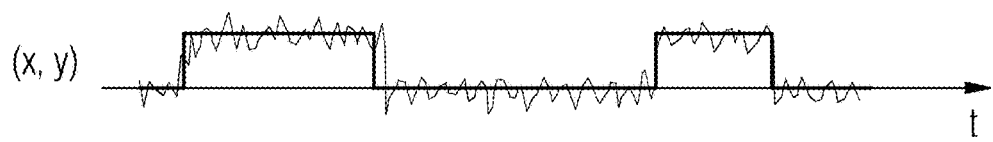
FIG. 8 shows an example of a pixel-time series compiled according to the invention.
Figure 9:
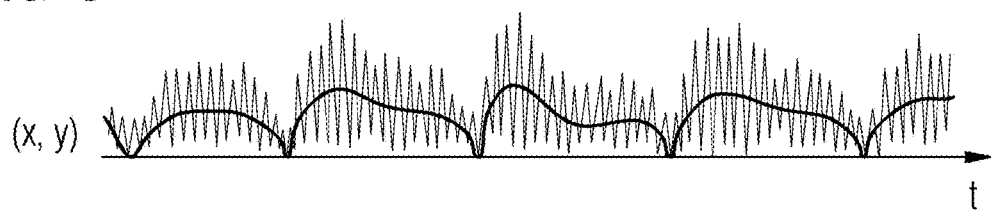
FIG. 9 shows a further example of a pixel-time series compiled according to the invention.

FIGS. 8 and 9 depict examples of pixel-time series compiled according to the invention. FIG. 8 shows the course of the intensities of a pixel (x,y) over time depicted by a thin line, in comparison with an fMRI paradigm depicted by a thicker line, as a comparison data set during which certain stimuli act on the examination object. FIG. 9 depicts an intensity profile of a pixel (x,y) over time with a thinner line in the comparison to the fitted signal profile from the MRF-database depicted with a thicker line as a comparison data set. Despite the undersampling of the measurement data sets on which the individual image data sets are based and the associated fluctuations in the intensity values of the pixel-time series according to the invention, the respective comparison data sets are firmly in the middle of the fluctuations. This shows that both a spatial and (particularly in the case of application with fMRI) temporal shift of intensity values in the reconstructed image data sets were avoided by the inventive compilation of the pixel-time series.

Figure 10:
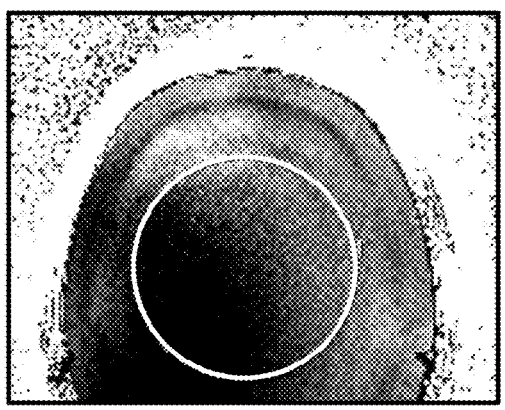
FIG. 10 is a comparison of a parameter map that is not determined based on pixel-time series generated according to the invention, with a parameter map determined based on pixel-time series generated according to the invention.
Figure 10:
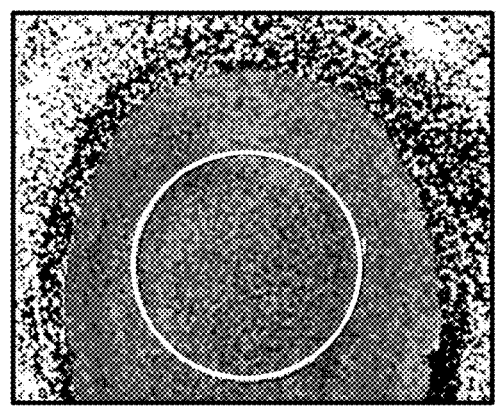

FIG. 10 compares a parameter map that was not determined based on pixel-time series generated according to the invention (left) with a corresponding parameter map determined based on pixel-time series generated according to the invention (right). In the parameter map depicted on the left, shading artifacts are clearly visible while, on the right, no such artifacts can be seen in the depicted parameter map determined from pixel-time series compiled with the method according to the invention, which is otherwise determined in the same way. Hence, the use of the pixel-time series generated according to the invention in order to determine the parameter map has resulted in a reduction in, if not the complete avoidance of, undesirable artifacts.

Figure 11:
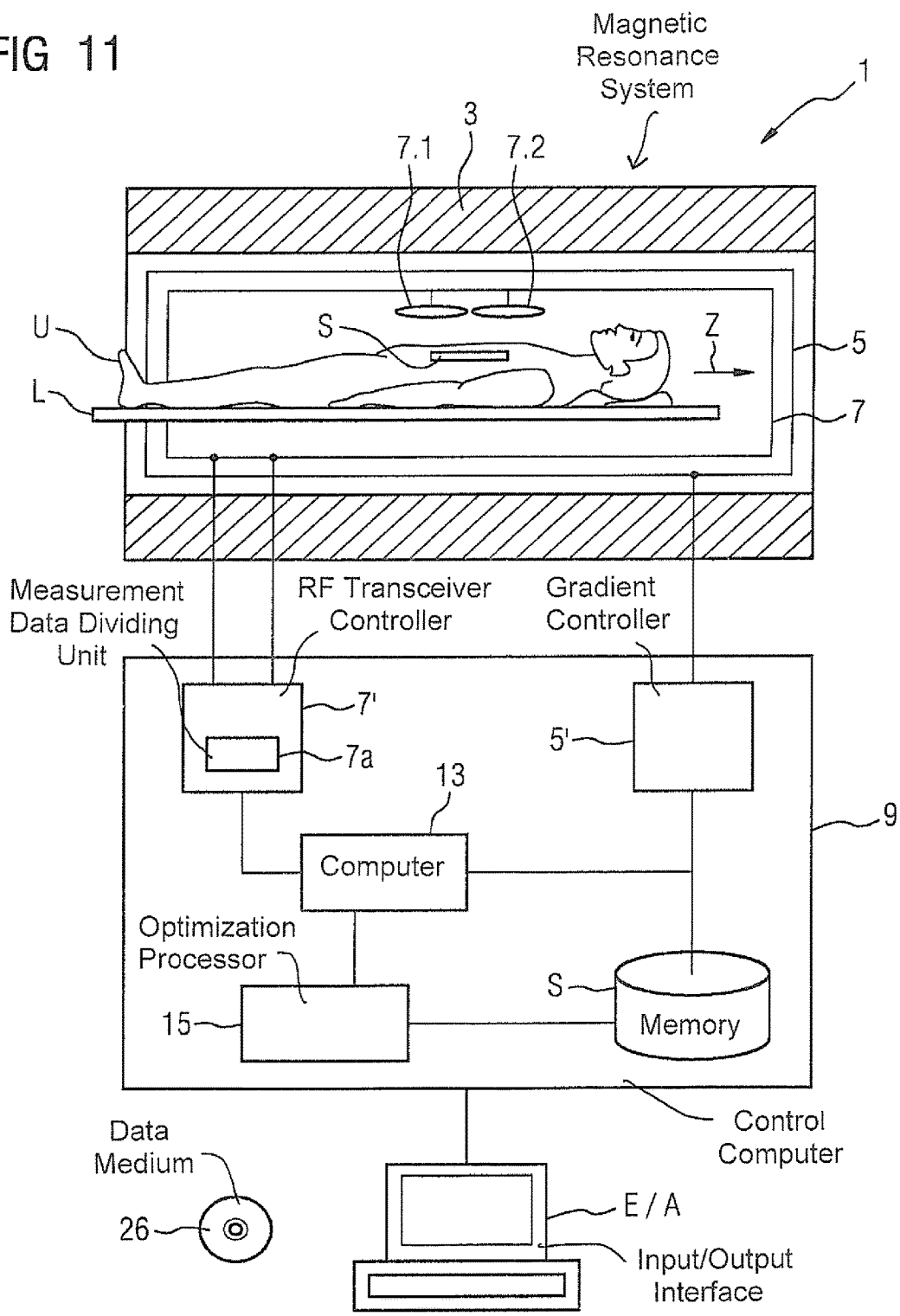
FIG. 11 is a schematic depiction of a magnetic resonance system according to the invention.

FIG. 11 is a schematic depiction of a magnetic resonance system 1 according to the invention. This has a scanner with a magnet 3 that generates the basic magnetic field, a gradient coil arrangement 5 for generating the gradient fields, a radio-frequency antenna 7 for radiating and receiving radio-frequency signals, and a control computer 9 designed to implement the method according to the invention. In FIG. 11, these sub-units of the magnetic resonance system 1 are only shown in a schematic depiction. In particular, the radio-frequency antenna 7 can have a number of sub-units, for example a number of individual coils, such as the schematically depicted coils 7.1 and 7.2, or more coils that can be designed either only to radiate radio-frequency signals or only to receive the triggered radio-frequency signals, or for both.

To examine an examination object U, such as a patient or a phantom, the object can be introduced into the scanning volume of the scanner of the magnetic resonance system 1 on a table L. The slice S represents an exemplary target volume of the examination object from which measurement data can be recorded.

The control computer 9 serves to control the magnetic resonance system 1 and can control the gradient coil arrangement 5 via a gradient controller 5' and the radio-frequency antenna 7 via a radio-frequency transceiver controller 7'. The radio-frequency antenna 7 and controller 7' can have a number of channels in which signals can be transmitted or received.

Together with its radio-frequency transceiver controller 7', the radio-frequency antenna 7 is responsible for the generation and the radiation (transmission) of a radio-frequency alternating field for giving a magnetization to certain nuclear spins in a region (for example in slices S to be measured) of the examination object U. For this purpose, the mid-frequency of the radio-frequency alternating field, also called the B1 field, must lie close to the resonance frequency of the spins to be given a magnetization. For the generation of the B1 field, in the radio-frequency antenna 7, currents controlled by the radio-frequency transceiver controller 7' are applied to the RF coils. A measurement-data dividing unit 7a according to the invention, which can, for example be part of the radio-frequency transceiver control system 7', determines which measurement data is to be recorded according to the invention and to which data set they are to be assigned.

The control computer 9 furthermore has an optimization processor 15 with which selection of k-space trajectories according to the invention can be optimized. The control computer 9 is overall designed to implement the method according to the invention for avoiding artifacts with the acquisition of MR data for an examination object.

A computer 13 of the control computer 9 is designed to carry out all the computing operations required for the necessary measurements and determinations. Any interim results and results required for this or determined hereby can be stored in a memory S of the control computer 9. The shown components need not necessarily be physically separate units, but merely constitute a subdivision into logical units, which can be implemented in fewer physical units, or even in just one physical unit.

Via an input/output interface E/A of the magnetic resonance system 1, a user can enter control commands to the magnetic resonance system 1 and/or be shown results of the control computer 9 such as image data.

The method described herein can also be provided in the form of computer program code stored on an electronically readable data medium 26, that causes the control computer 9 to implement the described method when the data medium 26 is loaded into the control computer 9.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for generating a pixel-time series of an examination subject by operation of a magnetic resonance (MR) apparatus, said method comprising:

from a computer system, operating an MR data acquisition scanner of an MR apparatus to execute a data acquisition with a pulse sequence comprising radiating radio-frequency (RF) pulses and activating at least one gradient magnetic field, in order to excite nuclear spins in the subject so as to produce echo signals;

from said computer system, operating said MR data acquisition scanner in said pulse sequence to read out MR data during said echo signals, and entering said MR data into k-space along a first trajectory in an electronic memory organized as k-space, in order to produce an MR data set that is undersampled according to the Nyquist theorem;

from said computer system, operating said MR data acquisition scanner to repeat said data acquisition at least once, thereby operating said MR data acquisition scanner in multiple data acquisitions with at least one of the RF pulses or the magnetic gradients being different in respective data acquisitions, in order to enter MR data in the respective acquisitions along a different trajectory in k-space that is different from said first trajectory;

collectively for all repetitions of said pulse sequence in the respective data acquisitions, executing, in said computer system, a selection algorithm that produces an optimized set of said different trajectories in k-space that are individually used in the respective repetitions, in which the different trajectories in said optimized set are optimized with respect to a succession in which said different trajectories are used in respective repetitions;

in said computer system, executing a reconstruction algorithm to reconstruct an image data set respectively from each MR data set of the respective data acquisitions, each image data set being comprised of at least one pixel;

in said computer system, forming at least one pixel-time series for at least one same, corresponding pixel in the respective reconstructed image data sets, that represents a signal intensity of said at least one pixel over a time that occurs for said repetitions of said pulse sequence in the respective data acquisitions; and storing said pixel-time series in a time series memory in a form accessible by said computer system in order to make said time series electronically available as an output from said computer system.

2. A method as claimed in claim 1 comprising, in said selection algorithm, determining each trajectory in k-space by at least one of applying an operator to said first trajectory that performs at least one of a rotation or a translation of said first trajectory, or shortening another trajectory in k-space.

3. A method as claimed in claim 1 comprising, for each trajectory in k-space, entering said MR data into k-space with sampling selected from the group consisting of Cartesian sampling, spiral sampling and radial sampling.

4. A method as claimed in claim 1 comprising, in said computer system, accessing said at least one pixel-time series from said time series memory and comparing the accessed pixel-time series with a comparison data set in order to obtain a comparison result that represents information about said examination object.

5. A method as claimed in claim 1 comprising using, as said comparison data set, a signal profile from an MR fingerprinting database, or a paradigm of an MR magnetic resonance method.

6. A method as claimed in claim 1 comprising executing said selection algorithm dependent on the number of different k-space trajectories that were used in the respective data acquisitions, and a degree of undersampling of said MR data set.

7. A method as claimed in claim 1 comprising executing said selection algorithm starting from an unoptimized set of said different trajectories in k-space along with said MR data are to be acquired at least once and, in successive data acquisitions, and producing said optimized set by selecting a respective trajectory in k-space to be used in a respective data acquisition either randomly or non-consecutively from said unoptimized set.

8. A method as claimed in claim 1 comprising executing said selection algorithm to select respective trajectories in k-space for respective successive data acquisitions in which said magnetic gradients alternate from data acquisition-to-data acquisition.

9. A method as claimed in claim 1 comprising executing said selection algorithm to select said further trajectories in k-space by, starting from said first trajectory, an incremental rotation or an incremental translation from data acquisition-to-data acquisition.

10. A method as claimed in claim 9 comprising executing said selection algorithm using said incremental rotation, and selecting the respective trajectories in k-space from data acquisition-to-data acquisition as a smallest rotation increment between respective trajectories in two successive data acquisitions, said smallest rotation increment being calculated for all of said data acquisitions.

11. A method as claimed in claim 9 comprising executing said selection algorithm using said incremental translation, and selecting the respective trajectories in k-space from data acquisition-to-data acquisition as a smallest translation increment between respective trajectories in two successive data acquisitions, said smallest translation increment being calculated for all of said data acquisitions.

12. A method as claimed in claim 1 comprising, in said selection algorithm, optimizing selection of the k-space trajectories according to at least one criterion selected from the group consisting of reducing artifacts in the reconstructed image data sets, reducing a spatial shift of the intensity values of the pixels in the reconstructed image data sets, and reducing a temporal shift of the intensity values of the pixels of the reconstructed image data sets.

13. A magnetic resonance (MR) apparatus comprising:
an MR data acquisition scanner;
a computer system configured to operate the MR data acquisition scanner to execute a data acquisition with pulse sequence that includes radiating radio-frequency (RF) pulses and activating at least one gradient magnetic field, in order to excite nuclear spins in the subject so as to produce echo signals;
said computer system being configured to operate said MR data acquisition scanner in said pulse sequence to read out MR data during said echo signals and to enter said MR data into k-space along a first trajectory in an electronic memory organized as k-space, in order to produce an MR data set that is undersampled according to the Nyquist theorem;
said computer system being configured to operate said MR data acquisition scanner to repeat said data acquisition at least once, thereby operating said MR data acquisition scanner in multiple data acquisitions with at least one of the RF pulses or the magnetic gradients being different in respective data acquisitions, in order to enter MR data in the respective data acquisitions along a different trajectory in k-space that is different from said first trajectory;
said computer system being configured to execute, collectively for all repetitions of said pulse sequence in the respective data acquisitions, a selection algorithm that produces an optimized set of said different trajectories in k-space that are individually used in the respective repetitions, in which the different trajectories in said optimized set are optimized with respect to a succession in which said different trajectories are used in respective repetitions;
said computer system being configured to execute a reconstruction algorithm to reconstruct an image data set respectively from each MR data set of the respective acquisitions, each image data set being comprised of at least one pixel;
said computer system being configured to form at least one pixel-time series for at least one same, corresponding pixel in the respective reconstructed image data sets, that represents a signal intensity of said at least one pixel over a time that occurs for said repetitions of said pulse sequence in the respective data acquisitions; and
said computer system being configured to store said pixel-time series in a time series memory in a form accessible by said computer system in order to make said time series electronically available as an output from said computer system.

14. A non-transitory, computer-readable data storage medium encoded with programming instructions, said storage medium being loaded into a computer system of a magnetic resonance (MR) apparatus that comprises an MR data acquisition scanner, said programming instructions causing said computer system to:
operate the MR data acquisition scanner to execute a data acquisition with a pulse sequence, by radiating radio-frequency (RF) pulses, while activating at least one gradient magnetic field, in order to excite nuclear spins in the subject so as to produce echo signals;
operate said MR data acquisition scanner in said pulse sequence to read out MR data during said echo signals and entering said MR data into k-space along a first trajectory in an electronic memory organized as k-space, in order to produce an MR data set that is undersampled according to the Nyquist theorem;
operate said MR data acquisition scanner to repeat said data acquisition at least once, thereby operating said MR data acquisition scanner in multiple data acquisitions with at least one of the RF pulses or the magnetic gradients being different in respective data acquisitions, in order to enter MR data in the respective data acquisitions along a different trajectory in k-space that is different from said first trajectory;
collectively for all repetitions of said pulse sequence in the respective data acquisitions, execute a selection algorithm that produces an optimized set of said different trajectories in k-space that are individually used in the respective repetitions, in which the different trajectories in said optimized set are optimized with respect to a succession in which said different trajectories are used in respective repetitions;
execute a reconstruction algorithm to reconstruct an image data set respectively from each MR data set of the respective data acquisitions, each image data set being comprised of at least one pixel;

form at least one pixel-time series for at least one same, corresponding pixel in the respective reconstructed image data sets, that represents a signal intensity of said at least one pixel over a time that occurs for said repetitions of said pulse sequence in the respective data acquisitions; and store said pixel-time series in a time series memory in a form accessible by said computer system in order to make said time series electronically available as an output from said computer system.

* * * * *